United States Patent [19]

Mizuta

[11] Patent Number: 4,994,745
[45] Date of Patent: Feb. 19, 1991

[54] ELECTRON SPIN RESONANCE SPECTROSCOPY

[75] Inventor: Yukio Mizuta, Tokyo, Japan
[73] Assignee: Jeol, Ltd., Tokyo, Japan
[21] Appl. No.: 468,896
[22] Filed: Jan. 23, 1990

[30] Foreign Application Priority Data

Jan. 23, 1989 [JP] Japan .................................. 1-13598

[51] Int. Cl.$^5$ .......................................... G01R 33/24
[52] U.S. Cl. .................................... 324/316; 324/308
[58] Field of Search ............... 324/301, 308, 316, 317, 324/307

[56] References Cited

U.S. PATENT DOCUMENTS 3,348,136 10/1967 Nelson et al. ..................... 324/317
3,371,271 2/1968 Takeuchi et al. .................. 324/317
4,376,264 3/1983 Dokter et al. ..................... 324/316

OTHER PUBLICATIONS

King et al., "The Application of the Zeeman Effect . . . Measurement of Pulsed Magnetic Fields", Proceedings of the Royal Society of London, A, 323, 431–442, 1971.

Primary Examiner—Michael J. Tokar
Assistant Examiner—Kevin D. O'Shea
Attorney, Agent, or Firm—Webb, Burden, Ziesenheim & Webb

[57] ABSTRACT

There is disclosed a method of accurately calculating the magnetic field strength at an arbitrary position in an ESR (electron spin resonance) spectrum using $Mn^{2+}$ marker. The spectrum contains an ESR signal arising from an unknown sample and an ESR signal arising from a reference sample containing $Mn^{2+}$ marker. The resonating magnetic field strengths $H_{ci}$ and $H_{cj}$ of two absorption lines of the six absorption lines arising from $Mn^{2+}$ are calculated from the applied microwave frequency, the nuclear spin quantum numbers $m_{Ii}$ and $m_{Ij}$ producing the two absorption lines, a predetermined g value $g_o$ intrinsic to $Mn^{2+}$, and a predetermined isotropic hyperfine coupling constant A. The magnetic field strength $H_{cx}$ at a position of interest in the ESR spectrum is determined from the distance between the absorption lines, the distance between the position and one of the two absorption lines, and the magnetic field strengths $H_{ci}$, $H_{cj}$.

2 Claims, 5 Drawing Sheets

```
10 '****MANGANESE MARKER****
20 '
30 DIM V(2),P(2,6)
40 '
50 V(1)=9.44902E+09:V(2)=9.18739E+09
60 P(1,1)=3154.38:P(1,2)=3236.6:P(1,3)=3321.06
70 P(1,4)=3407.9:P(1,5)=3496.9:P(1,6)=3588.06
80 P(2,1)=3060.67:P(2,2)=3142.98:P(2,3)=3227.48
90 P(2,4)=3314.22:P(2,5)=3403.32:P(2,6)=3494.6
100 '
110 INPUT" INPUT G CENTER       ";GO
120 INPUT" INPUT G STEP         ";GS
125 INPUT" INPUT G RANGEn*STEP  ";GR
130 INPUT" INPUT A CENTER       ";AO
140 INPUT" INPUT A STEP         ";AS
145 INPUT" INPUT A RANGE n*STEP ";AR
150 '
160 H=6.62618E-34
170 B=9.27408E-28
180 K=H/B
190 '
200 MIN=10000
210 FOR G=GO-GR*GS TO GO+GR*GS STEP GS
220 FOR A=AO-AR*AS TO AO+AR*AS STEP AS
230 GOSUB *CALC
240 IF SIGMA<MIN THEN MIN=SIGMA:GMIN=G:AMIN=A
250 NEXT A:NEXT G
252 PRINT:PRINT:PRINT
254 PRINT"***** RESULT *****"
260 PRINT" G RANGE:";GO-GR*GS;"- ";GO+GR*GS
270 PRINT" A RANGE:";AO-AR*AS;"- ";AO+AR*AS
272 PRINT" G (MIN) ="; GMIN
274 PRINT" A (MIN) ="; AMIN
276 PRINT" S (MIN) ="; MIN
278 PRINT"***************************"
280 END
290 '*** SUBROUTINE S(G,A)***
300 *CALC
310   SIGMA=0
320   FOR Q=1 TO 2:JO=K*V(Q)/G
330   FOR R=1 TO 6:M1=R+3.5
340   J1=JO-A*M1-A^2/2/JO*(35/4-M1^2)
350   SIGMA=SIGMA+(P(Q,R)-J1)^2
360   NEXT R:NEXT Q
370 RETURN
```

```
run
  INPUT G CENTER     ? 2.00094
  INPUT G STEP       ? .00001
  INPUT G RANGE n*STEP ? 1
  INPUT A CENTER     ? 86.7667
  INPUT A .STEP      ? .0001
  INPUT A RANGE n*STEP ? 100

* * * * * RESULT * * * * *
G RANGE : 2.00093 - 2.00095
A RANGE : 86.7567 - 86.7767
G(MIN) = 2.00094
A(MIN) = 86.7654
S(MIN) = .0373142
* * * * * * * * * * * * * * * *

ELECTRON SPIN RESONANCE SPECTROSCOPY

FIELD OF THE INVENTION

The present invention relates to electron spin resonance spectroscopy and, more particularly, to electron spin resonance spectroscopy capable of determining the magnetic field strength at an arbitrary position in an ESR spectrum, using a manganese marker.

BACKGROUND OF THE INVENTION

In electron spin resonance spectroscopy, a microwave is applied to a sample placed in a static magnetic field that is swept. An ESR (electron spin resonance) spectrum is obtained by taking the first-order derivative of a microwave absorption curve as a function of the magnetic field. Thus, the absorption intensity is plotted on the vertical axis of the spectral chart and the magnetic field strength on the horizontal axis. Generally, the magnetic field strength (resonating magnetic field) of the resonant spectrum is given by $$H = \frac{h\nu}{g\beta} \quad (1)$$

where $\nu$ is the frequency of microwaves, h is the Planck's constant, $\beta$ is the Bohr magneton, and the value of g is intrinsic to the material. The factor g is one of the most important factors, as well as the hyperfine coupling constant and the line width, in determining from what paramagnetic species the ESR spectrum arises. An unknown sample is identified as follows. A known marker is used so that an absorption line of the marker may appear in an ESR spectrum together with the absorption line of the unknown sample. The magnetic field strength is found from the g value of the absorption line of the marker. The g value of the unknown sample is calculated from the resonating magnetic field strength H of the unknown sample and from the microwave frequency $\nu$.

DPPH (2.0036), TCNQ-Li salt (2.0026), and $Cr^{3+}$ (1.98) are used for calculating g values. Also, $Mn^{2+}$ marker, or manganese marker, has been frequently used either in ESR measurement for quantitative analysis of a paramagnetic substance contained in an unknown sample or as an external reference for measuring the g value.

Since like substances have like g values, it is required to determine g values accurately to identify such substances accurately. Except for $Mn^{2+}$ marker, however, every marker produces a single absorption line and so the magnetic field of a spectrum can be calibrated only at one point. Therefore, it is inevitable that g values are calculated at low accuracy.

On the other hand, $Mn^{2+}$ marker gives rise to 6 absorption lines because of its nuclear spin quantum number $I=5/2$. If the g values of these absorption lines are known, therefore, the horizontal axis of the spectrum, or the magnetic field, can be calibrated at plural points. For this reason, the magnetic field strength of the absorption line of an unknown sample can be accurately calibrated. Hence, the g value can be accurately determined.

However, the g values of the individual absorption lines vary, depending on the frequency of the applied microwaves, because the six absorption lines of the $Mn^{2+}$ marker are produced by its hyperfine structure. The g values of the third and the fourth absorption lines change relatively little, depending on the applied microwave frequency. In the past, it has been assumed that the g values of these two intermediate absorption lines are kept constant, irrespective of the applied microwave frequency, and the g values of the absorption lines of unknown samples would have been calculated from the g values of these two absorption lines.

In this method, however, high accuracy is not obtained in essence, because it neglects the fact that g values vary according to the applied microwave frequency.

SUMMARY OF THE INVENTION

It is an object of the present invention to provide a method of accurately determining the magnetic field strength at an arbitrary position in an ESR spectrum by the use of $Mn^{2+}$ marker, for accurately calculating g values.

In one feature of the present invention, an ESR spectrometer is characterized by the provision of a counter that measures the frequency of applied microwaves such that magnetic field strengths and g values can be calculated accurately as described above.

As mentioned previously, $Mn^{2+}$ marker gives rise to 6 absorption lines in an ESR spectrum. The present invention provides a g value (hereinafter referred to as $g_o$) corresponding to the virtual mean position of the 6 absorption lines and an isotropic hyperfine coupling constant A. An ESR spectrum containing plural absorption lines attributed to $Mn^{2+}$ marker is obtained. The frequency $\nu$ of the applied microwaves is measured. The magnetic field strength at an arbitrary position in an ESR spectrum is found in the manner described below. From equation (1) above, the magnetic field strength at the virtual mean position is given by $$H_o = h\nu/g_o\beta$$

where h is the Planck's constant, $\nu$ is the frequency of the applied microwaves, $g_o$ is the aforementioned g value, and $\beta$ is the Bohr magneton. Using the magnetic field strength $H_o$, the coupling constant A, the nuclear spin quantum number I ($I=5/2$ in the case of $Mn^{2+}$), and the components $m_I$ of the values of the spin quantum number I projected on the static magnetic field, we have $$H_c = H_o - A\, m_I - A^2\{I(I+1) - m_I^2\}/2H_o$$

From this equation, the magnetic field strengths $H_{ci}$ and $H_{cj}$ at the positions of some of the six absorption lines produced by $Mn^{2+}$ are calculated. Then, the magnetic field strength at an arbitrary position in the ESR spectrum is correctly calculated from the positional relation of this arbitrary position to the abovedescribed absorption lines.

Other objects and features of the invention will appear in the course of the description thereof which follows.

DESCRIPTION OF THE PREFERRED EMBODIMENTS

Figure 1:
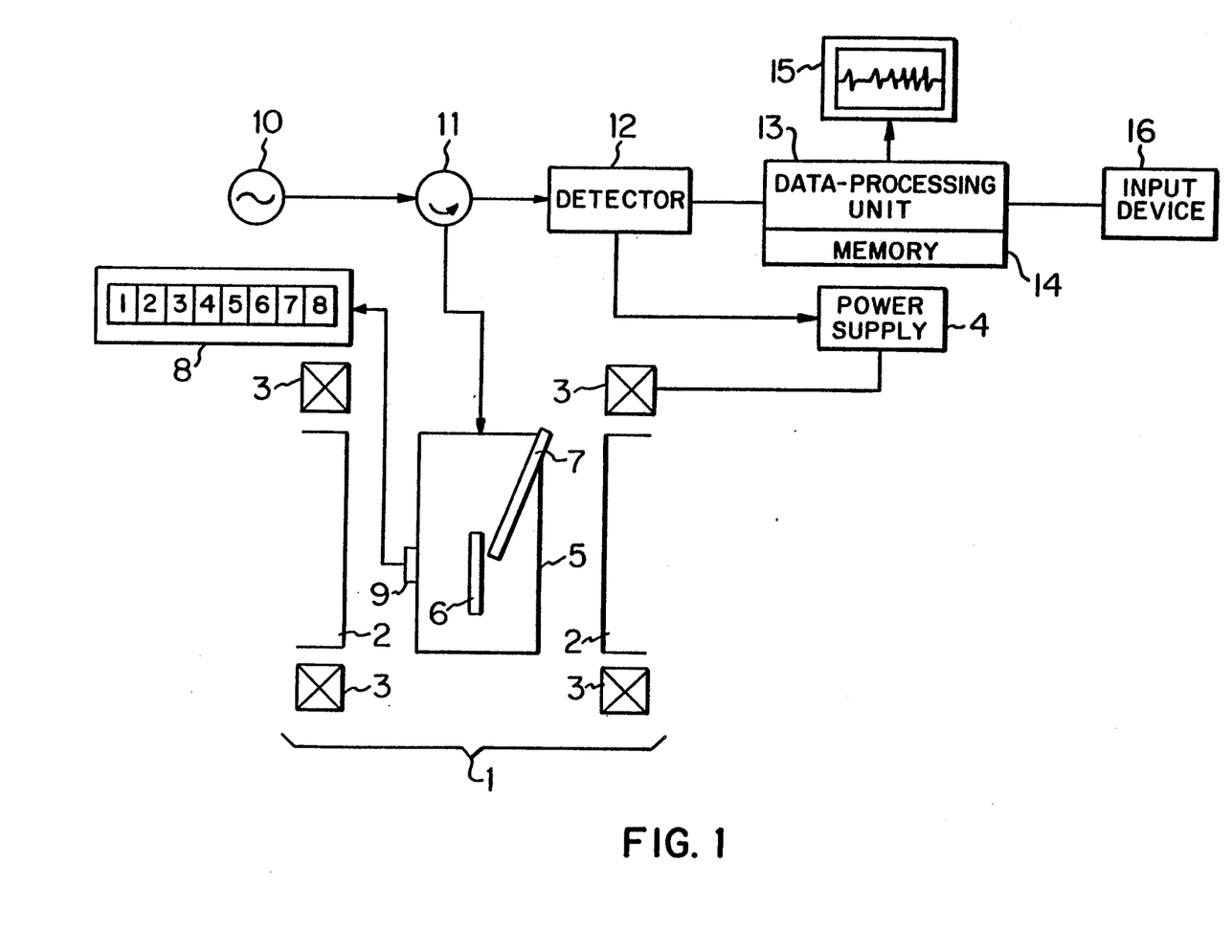
FIG. 1 is a block diagram of an ESR spectrometer according to the invention.

Referring to FIG. 1, there is shown an ESR (electron spin resonance) spectrometer embodying the concept of the invention. This spectrometer includes an electromagnet 1 consisting of the pair of opposite magnetic pole pieces 2 and 2', exciting coils 3, and an exciting power supply 4. A microwave cavity 5 is disposed at the center of the static magnetic field produced between the magnetic pole pieces 2 and 2'. A sample 6 to be investigated and a reference sample 7 containing $Mn^{2+}$ are placed inside the cavity 5. If necessary, a sensor 9 ancillary to a magnetic detector 8 is inserted in the static magnetic field. Microwaves produced by a microwave generator 10, such as a Gunn oscillator, are supplied into the cavity 5 via a circulator 11. When the electron spins of the sample resonate, reflecting waves are emitted from the cavity 5 and introduced via the circulator 11 into a detector 12, where the waves are detected. The resulting ESR signal is converted into digital form, supplied to a dataprocessing unit 13, and stored in a memory 14 ancillary to the processing unit 13, which is equipped with a display unit 15 and an input device 16.

ESR spectra of nuclei possessing nuclear spins such as $Mn^{2+}$ can be theoretically explained by considering the interaction among the electron spin quantum number S, the nuclear spin quantum number I, and the external magnetic field H. Energies of electron spin levels are expressed in terms of the following Hamiltonian:

$$H = \beta H \hat{g} S + I \hat{A} S \quad (2)$$

where g is a $\hat{g}$ tensor, and $\hat{A}$ is a hyperfine coupling tensor. S, I, and H are all vectors. In equation (2), the first term of the right side is the electron Zeeman term, and the second term of the right side indicates hyperfine coupling. Since the first term is usually much larger than the second term, the second term is treated as a perturbation term in expanding equation (2). As the contribution of the second term increases and can no longer be neglected compared with the contribution of the first term, the second term, or the perturbation term, is required to be expanded up to a higher order. For ordinary organic free radicals, the second term is much smaller than the first term and, therefore, it suffices to expand the perturbation term up to the first order. Under this condition, the resonating magnetic field is given by $$H_c = H_o - A m_I \quad (3)$$

where A is the isotropic hyperfine coupling constant, $m_I$ is the component of I projected on H, and $H_o$ is the magnetic field strength at the virtual mean position of the spectrum. Using the g value $g_o$ corresponding to the virtual mean position, the magnetic field strength $H_o$ is given by $$H_o = h\nu / g_o \beta \quad (5)$$

Where the applied microwave frequency lies within the X band of 9000 to 9500 MHz, the magnetic field strength $H_o$ of $Mn^{2+}$ marker in an ESR signal is about between 3300 and 3400 G, and the coupling constant A is approximately between 80 and 90 G. In this case, the coupling constant A is not negligibly small compared with the magnetic field strength $H_o$. As a consequence, the equation is required to be expanded to a higher order. By adding the second-order perturbation term to equation (3), we have $$H_c = H_o - A m_I - \frac{A^2}{2H_o} \{I(I+1) - m_I^2\} \quad (4)$$

According to equation (3), hyperfine splittings occur at regular intervals of A. According to equation (4), hyperfine splittings do not take place regularly because of the third term of the right side.

The nuclear spin quantum number of $Mn^{2+}$ is $I = 5/2$. The nuclear spin magnetic quantum number $m_I$ that is the component of the nuclear spin quantum number projected on the axis of the static magnetic field can assume 6 discrete states of $5/2$, $3/2$, $\frac{1}{2}$, $-\frac{1}{2}$, $-3/2$, and $-5/2$ which successively differ by one. Therefore, the ESR signal of $Mn^{2+}$ marker is split into 6 absorption lines, as shown in FIGS. 2(a) and 2(b).

Figure 2A:
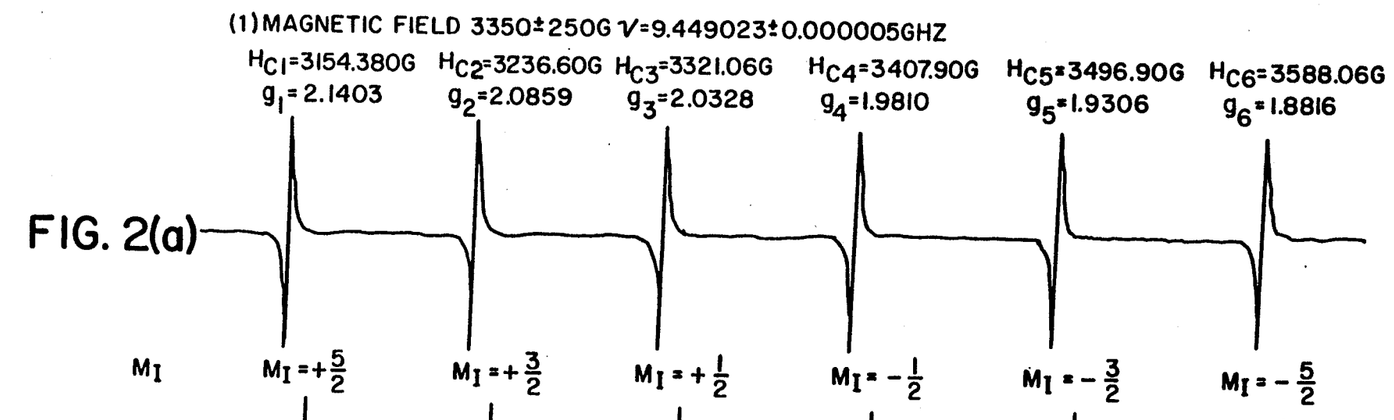
FIGS. 2(a) and 2(b) are ESR spectra of $Mn^{2+}$ obtained by the use of the spectrometer shown in FIG. 1.
Figure 2B:
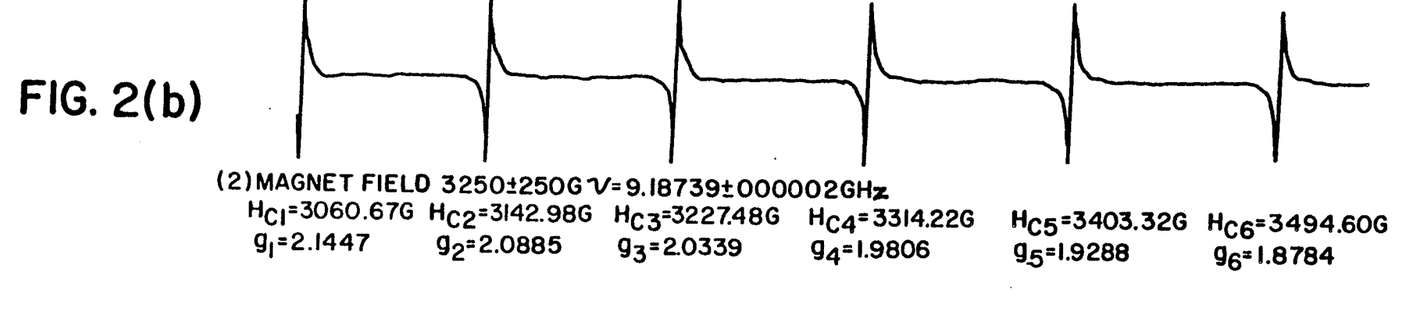

FIGS. 2(a) and 2(b) show ESR spectra of contained in the reference sample 7. The spectra were obtained using the spectrometer shown in FIG. 1. During the measurement, the static magnetic field was swept from $3350 - 250$ G to $3350 + 250$ G. The frequency $\nu$ of the microwaves was set to 9449.023 MHz and 9187.39 MHz. When the static magnetic field was swept, the strength of the magnetic field was monitored by the magnetic field detector 8. Magnetic field strengths $H_{c1}$, ..., $H_{c6}$ which are put above or below the absorption lines in the spectra were obtained by this detector 8. G values $g_1$, ..., $g_6$ that are put below the field strengths $H_{c1}$, ..., $H_{c6}$ were calculated from the field strengths $H_{c1}$, ..., $H_{c6}$ and from $\nu$ in accordance with equation (1).

As can be seen from FIGS. 2(a) and 2(b), changing the microwave frequency $\nu$ varies the positions of the six absorption lines, or the resonating magnetic fields, accordingly.

The g value $g_o$ and the coupling constant A included in equations (4) and (5) do not depend on the microwave frequency and assume values intrinsic to $Mn^{2+}$. Thus, the magnetic field strengths of the six absorption lines arising from $Mn^{2+}$ can be calculated by previously finding $g_o$ and A empirically and substituting the applied microwave frequency $\nu$ into equations (4) and (5). Then, the magnetic field strength at an arbitrary position in a spectrum can be calculated from the calculated magnetic field strengths of the absorption lines.

The values of $g_o$ and the coupling constant A can be determined from the results of measurements shown in FIGS. 2(a) and 2(b). As an example, $g_o$ and A are varied as parameters. The magnetic field strengths of the absorption lines which are calculated in accordance with equations (4) and (5) are compared with actually measured magnetic field strengths. The differences between them are minimized by the self-consistent field method. In this way, correct values of $g_o$ and A can be found.

In a specific example, parameters $g_o$ and A were found which minimize the difference $\sigma(g_o, A)$ between the actually measured resonating magnetic field strength $H_R(\nu_i, m_I)$ and the resonating magnetic field strength $H_c(\nu_i, m_I)$ calculated in accordance with equation (4).

$$\sigma(g_o, A) = \sum_{\nu_i} \sum_{m_I} [H_R(\nu_i, m_I) - H_c(\nu_i, m_I)]^2 = \quad (6)$$

$$\sum_{\nu_i} \sum_{m_I} \left[ H_R(\nu_i, m_I) - H_o(\nu_i) - Am_I - \frac{A^2}{2 H_o(\nu_i)} \{I(I+1) - m_I^2\} \right]^2$$

Figure 3A:
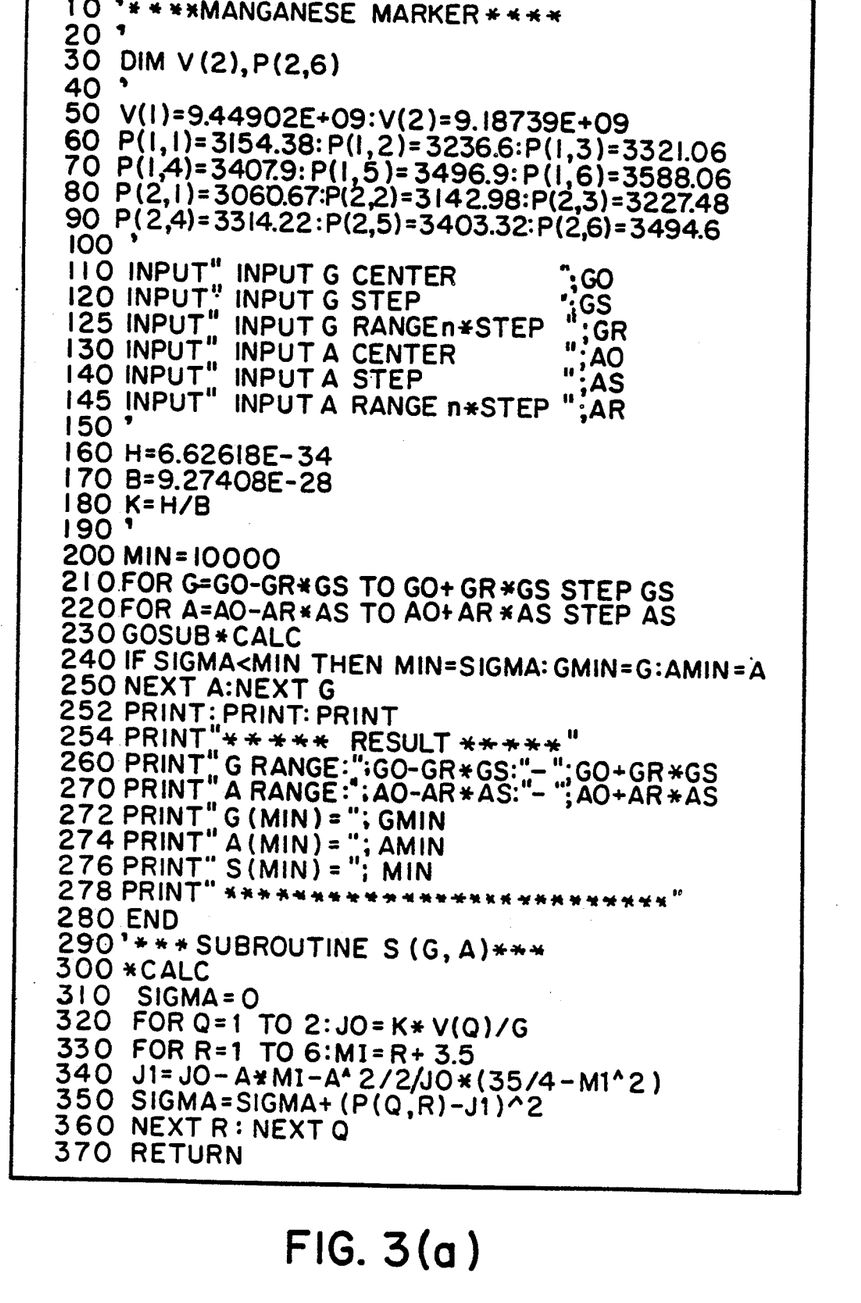
FIG. 3(a) illustrates a computer program used to calculate the g value go at the virtual mean position.
Figure 3B:
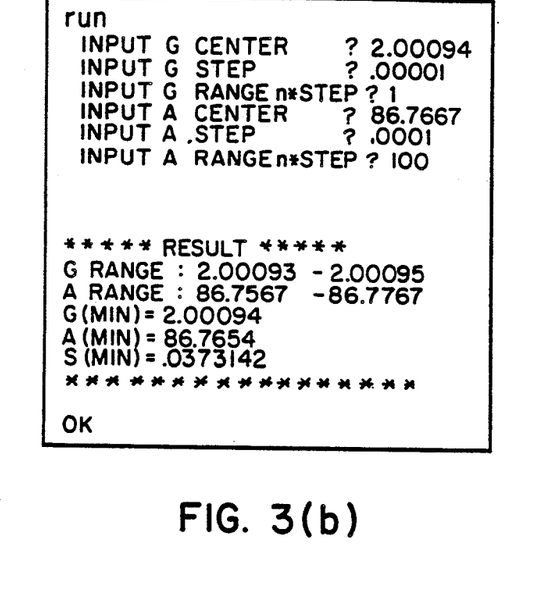
FIG. 3(b) illustrates the results of calculations performed with the program shown in FIG. 3(a)

As a result, a minimum dispersion value $\sigma(g_o, A) = 0.0373$ was obtained at $g_o = 2.00094$ and $A = 86.77$ G. The computer programs used for the calculation are shown in FIGS. 3(a) and 3(b).

Table 1 shows actually measured magnetic field strengths H(measured) of the 6 absorption lines of $Mn^{2+}$ marker at $\nu = 9449.02$ MHz and $\nu = 9187.39$ MHz, magnetic field strengths H(theoretical) calculated from $g_o$ and A found as described above, their differences $\Delta_H$, and apparent g values g(theoretical) calculated from the above-described theoretical values. All the magnetic field strengths are expressed in G.

TABLE 1

| Microwave frequency (MHz) | mI | H (measured) | H (theoretical) | ΔH | g (theoretical) |
|---|---|---|---|---|---|
| 9449.02 | 5/2 | 3154.38 | 3154.30 | 0.08 | 2.14031 |
|  | 3/2 | 3236.60 | 3236.60 | 0.00 | 2.08588 |
|  | ½ | 3321.06 | 3321.13 | −0.07 | 2.03279 |
|  | −½ | 3407.90 | 3407.90 | 0.00 | 1.98104 |
|  | −3/2 | 3496.90 | 3496.90 | 0.00 | 1.93062 |
|  | −5/2 | 3588.06 | 3588.12 | −0.06 | 1.88153 |
| 9187.39 | 5/2 | 3060.67 | 3060.80 | −0.13 | 2.14462 |
|  | 3/2 | 3142.98 | 3142.97 | 0.01 | 2.08855 |
|  | ½ | 3227.48 | 3227.44 | 0.04 | 2.03388 |
|  | −½ | 3314.22 | 3314.21 | 0.01 | 1.98064 |
|  | −3/2 | 3403.32 | 3403.27 | 0.05 | 1.92880 |
|  | −5/2 | 3494.60 | 3494.62 | −0.02 | 1.87838 |

As can be seen from Table 1, the magnetic field strengths H(measured) of the resonance lines of $Mn^{2+}$ marker agree very well with the corresponding magnetic field strengths H(theoretical) at either microwave frequency. From Table 1, the mean value ΔHmean of deviations of the measured values from the theoretical values of the six absorption lines at the two frequencies is given by $$\Delta H\text{mean} = \left( \frac{\sigma(g_o, A)}{2 \times 6} \right)^{\frac{1}{2}} = 0.06 \text{ G} \quad (7)$$

Since the order of magnitude of this mean deviation coincides with the minimum order of magnitude (of the order of 0.01 G) that can be measured by an instrument, it can be regarded as experimental error. Thus, we have demonstrated that the aforementioned values $g_o = 2.00094$ and $A = 86.77$ G are appropriate.

Figure 4:
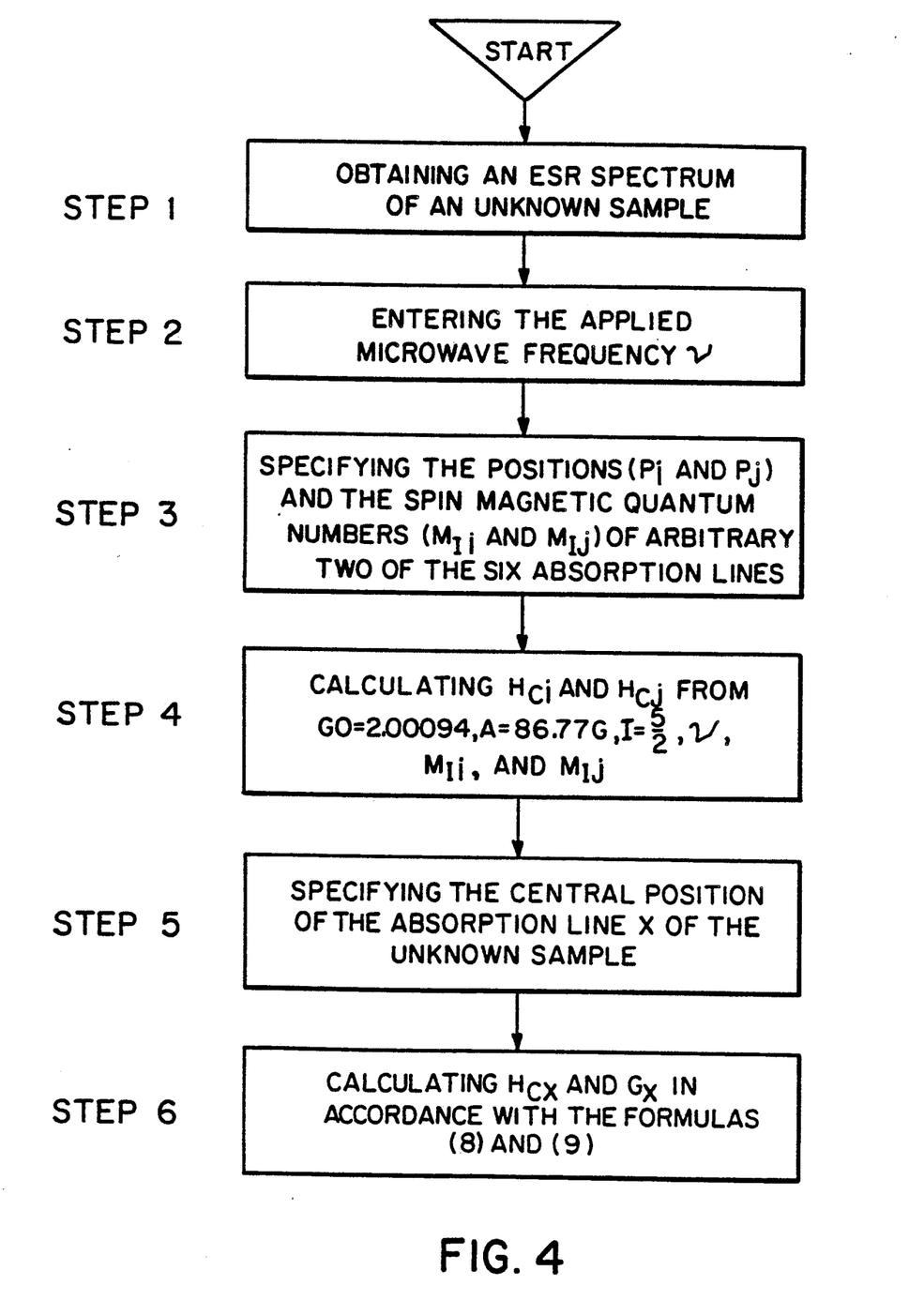
FIG. 4 is a flowchart illustrating a sequence of steps performed to determine the g value of an unknown sample in accordance with the present invention.

One example of a sequence in which the g value of an unknown sample is found in accordance with the present invention is next described by referring to the flowchart of FIG. 4.

Step 1

Figure 5:
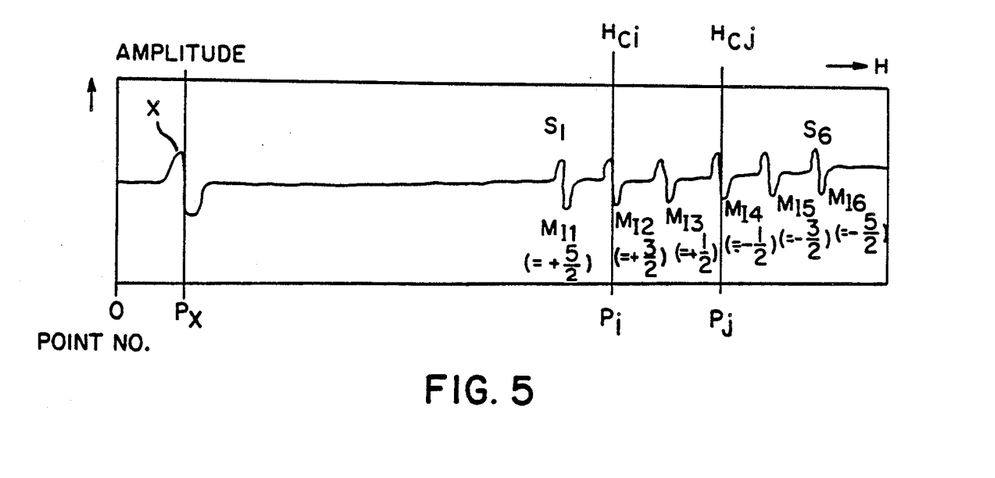
FIG. 5 is an ESR spectrum containing an absorption line arising from $Mn^{2+}$ and absorption lines of an unknown sample.

An ESR spectrum of an unknown sample is obtained, using the instrument shown in FIG. 1. This spectrum contains 6 absorption lines $S_1-S_6$ arising from $Mn^{2+}$ and an absorption line X arising from the unknown sample, as shown in FIG. 5. Data about the spectrum is stored in the memory 14 and sent to the display unit 15, where it is displayed.

Step 2

The operator enters the applied microwave frequency $\nu$ into the data-processing unit 13 from the input device 16, or the data-processing unit can automatically read and store the output from a frequency counter during the measurement.

Step 3

The operator specifies the positions of arbitrary two (the i-th and j-th) of the six absorption lines, using a position-specifying device which controls the position of a cursor or the like superimposed on the spectrum. At this time, if the displayed spectrum is enlarged in the direction of the horizontal axis, then it is easy to specify the center of each absorption line. The data-processing unit reads and stores the numerals ($P_i$ and $P_j$) given to the specified positions.

The operator also enters information indicating what absorption lines are the specified absorption lines, i.e., i and j, into the data-processing unit from the input device. The data-processing unit finds the spin magnetic quantum numbers $m_{Ii}$ and $m_{Ij}$ of the i-th and j-th absorption lines from a conversion table previously stored in the unit. Table 2 shows an example of the conversion table.

TABLE 2

| 1 | $m_{I1}$ | +5/2 |
|---|---|---|
| 2 | $m_{I2}$ | +3/2 |
| 3 | $m_{I3}$ | +½ |
| 4 | $m_{I4}$ | −½ |
| 5 | $m_{I5}$ | −3/2 |
| 6 | $m_{I6}$ | −5/2 |

If the operator directly enters the spin magnetic quantum numbers of the two absorption lines, such a conversion table is dispensed with.

Step 4

The data-processing unit calculates the resonating magnetic field strengths $H_{ci}$ and $H_{cj}$ of the i-th and j-th absorption lines from $g_o = 2.00094$, $A = 86.77$ G, $I = 5/2$ previously stored in the data-processing unit and from newly stores $\nu$, $m_{Ii}$, $m_{Ij}$ in accordance with equations (4) and (5).

Step 5

The operator specifies the central position of the absorption line X of the unknown sample with the position-specifying device. The data-processing unit reads and stores the numeral $P_x$ given to the specified position.

Step 6

The data-processing unit calculates the resonating magnetic field strength $H_{cx}$ of the absorption line of the unknown sample and the g value $g_x$ in accordance with the following formulas.

$$H_{cx} = H_{ci} + (P_x - P_i)(H_{cj} - H_{ci})/(P_j - P_i) \quad (8)$$

$$g_x = h\nu/\beta H_{cx} \quad (9)$$

In this way, in accordance with the present invention, if the microwave frequency $\nu$ applied during measurement is known, then the g value and the resonating magnetic field strength of the absorption line of an unknown sample which appears at an arbitrary position in a spectrum can be calculated. When the values of $g_o$ and A are found first, a magnetic detector is used. This operation can be performed in the manufacturing plant of the instrument. consequently, the user can precisely find the resonating magnetic field strength of the absorption line of an unknown sample and the g value without a magnetic detector.

In the present invention, the magnetic field strengths of the six absorption lines arising from $Mn^{2+}$ are precisely found. Utilizing these, the distortion of the horizontal axis of the ESR spectrum which is caused by nonlinearity of sweep of the magnetic field can be compensated for. In particular, the space between the first and second absorption lines of the six absorption lines originating from $Mn^{2+}$ is $A - 2A^2/H_o$. The space between the second and third lines is $A - 2A^2/H_o$. The space between the third and fourth lines is $A$. The space between the fourth and fifth lines is $A + 2A^2/H_o$. The space between the fifth and sixth lines is $A + 2A^2/H_o$. If the magnetic field is not swept exactly linearly, the spaces between the successive absorption lines deviate from the above values. By comparing the spaces between the six successive absorption lines arising from $Mn^{2+}$ in a spectrum with the above values, the magnetic field strength can be calibrated in the regions between the six absorption lines.

It is to be noted that the present invention is not limited to the above example, and that various changes and modifications are possible. In the above example, whenever a microwave frequency $\nu$ is entered, the resonating magnetic field strength is calculated. A method utilizing a look-up table or the like is also possible. Specifically, calculations are performed for various values of $\nu$ beforehand. A table is prepared according to the results of the calculations. When a value of $\nu$ is entered, the results of calculations can be quickly read out by referring to the table previously prepared.

Having thus described my invention with the detail and particularity required by the Patent Laws, what is claimed and desired to be protected by Letters Patent is set forth in the following claims.

What is claimed is:

1. Electron spin resonance spectroscopy method comprising the steps of:
   (a) obtaining an ESR spectrum containing both an ESR signal arising from a sample to be investigated and an ESR signal arising from $Mn^{2+}$ contained in a reference sample;
   (b) knowing the frequency $\nu$ of microwaves used to obtain the ESR spectrum;
   (c) calculating the resonating magnetic field strengths $H_{ci}$ and $H_{cj}$ of two absorption lines $S_i$ and $S_j$ (i, j = 1, 2, 3, ..., 6; i≠j) of the six absorption lines $S_1$–$S_6$ arising from $Mn^{2+}$, from the microwave frequency $\nu$, the nuclear spin quantum numbers $m_{Ii}$, $m_{Ij}$ giving rise to the two absorption lines, a predetermined g value $g_o$ intrinsic to $Mn^{2+}$, and a predetermined isotropic hyperfine coupling constant A, and in accordance with the following formulas:

$$H_c = H_o - A\, m_I - A^2\{(I+1) - m_I^2\}2H_o$$

$$H_o = h\nu/g_o\beta$$

where $I = 5/2$, $m_{I1} = 5/2$, $m_{I2} = 3/2$, $m_{I3} = \tfrac{1}{2}$, $m_{I4} = -\tfrac{1}{2}$, $m_{I5} = -3/2$, $m_{I6} = -5/2$, h is the Planck's constant, and $\beta$ is the Bohr magneton;

(d) finding the magnetic field strength Hcx at a position x of interest from the distance between the two absorption lines $S_i$ and $S_j$ in the ESR spectrum, the distance between the position x and one of said two absorption lines in the spectrum, and the resonating magnetic field, strengths $H_{ci}$, $H_{cj}$.

2. The electron spin resonance spectroscopy of claim 1, further including the step of calculating the g value $g_x$ at the position x of interest from the magnetic field strength $H_{cx}$ found at step (d) in accordance with the formula $$g_x = h\nu/\beta H_{cx}.$$

UNITED STATES PATENT AND TRADEMARK OFFICE
CERTIFICATE OF CORRECTION

PATENT NO. : 4,994,745
DATED : February 19, 1991
INVENTOR(S) : Yukio Mizuta

It is certified that error appears in the above-identified patent and that said Letters Patent is hereby corrected as shown below:

Column 2 Line 54 "abovedescribed" should read --above-described--.

Column 2 Line 66 "go" should read --$g_o$--.

Column 4 Line 26 after "of" insert --$Mn^{2+}$--.

Column 5 Line 27 "mI" should read --$m_I$--.

Column 5 Lines 26-27 "(theoretical" should read --(theoretical)--.

Column 7 Line 15 "$A + 2A^2$" should read --$A + A^2$--.

Claim 1 c Line 19 Column 8 "{(I+1)" should read --{ I(I+1)--.

Signed and Sealed this

Fourth Day of August, 1992

Attest:

DOUGLAS B. COMER

Attesting Officer

Acting Commissioner of Patents and Trademarks